United States Patent
Jin et al.

(10) Patent No.: US 7,709,312 B2
(45) Date of Patent: May 4, 2010

(54) METHODS FOR INDUCING STRAIN IN NON-PLANAR TRANSISTOR STRUCTURES

(75) Inventors: Been-Yih Jin, Lake Oswego, CA (US); Brian Doyle, Portland, OR (US); Uday Shah, Portland, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 495 days.

(21) Appl. No.: 11/540,863

(22) Filed: Sep. 29, 2006

(65) Prior Publication Data

US 2008/0079094 A1 Apr. 3, 2008

(51) Int. Cl.
*H01L 21/336* (2006.01)
(52) U.S. Cl. ............... 438/197; 438/300; 257/E21.431
(58) Field of Classification Search ................. 438/197, 438/299, 300, 200; 257/E21.431
See application file for complete search history.

(56) References Cited

U.S. PATENT DOCUMENTS

| 6,869,868 B2* | 3/2005 | Chiu et al. ............. 438/592 |
| 6,960,781 B2* | 11/2005 | Currie et al. ............ 257/19 |
| 2002/0086472 A1* | 7/2002 | Roberds et al. ........... 438/197 |
| 2004/0173812 A1* | 9/2004 | Currie et al. ............ 257/103 |
| 2006/0057802 A1* | 3/2006 | Nowak et al. ............ 438/206 |
| 2006/0088967 A1* | 4/2006 | Hsiao et al. ............. 438/296 |

OTHER PUBLICATIONS

Intel Corporation, "Intel tri-gate transistors will enable a new era in energy-efficient performance," http://www.intel.com/technology/silicon/tri-gate-demonstrated.htm, 2006.
Kavalieros, et al., "Tri-gate transistor architecture with high-k gate dielectrics, metal gates and strain engineering," VLSI Technology, 2006, pp. 50-51.
Thompson, SE, et al., "A logic nanotechnology featuring strained-silicon," IEEE Electron Device Letters, vol. 25, No. 4, Apr. 2004, pp. 191-193.

* cited by examiner

*Primary Examiner*—Tuan N. Quach
(74) *Attorney, Agent, or Firm*—Blakely, Sokoloff, Taylor & Zafman LLP

(57) ABSTRACT

Methods for inducing compressive strain in channel region of a non-planar transistor and devices and systems formed by such methods. In one embodiment, a method can include forming trenches in a semiconductor body adjacent to gate structure spacers. The semiconductor body can be situated on a substrate and in a different plane relative to the substrate. The gate structure can be situated on the semiconductor body and the silicon fin and perpendicular to the semiconductor body. After formation of the semiconductor body and the gate structure on the substrate, a dielectric material can be conformally deposited on the substrate and etched to form spacers on the semiconductor body and the gate structure. The substrate can be patterned and etched to form trenches in the semiconductor body adjacent to the spacers on the gate structure. A strain material can be introduced into the trenches.

12 Claims, 9 Drawing Sheets

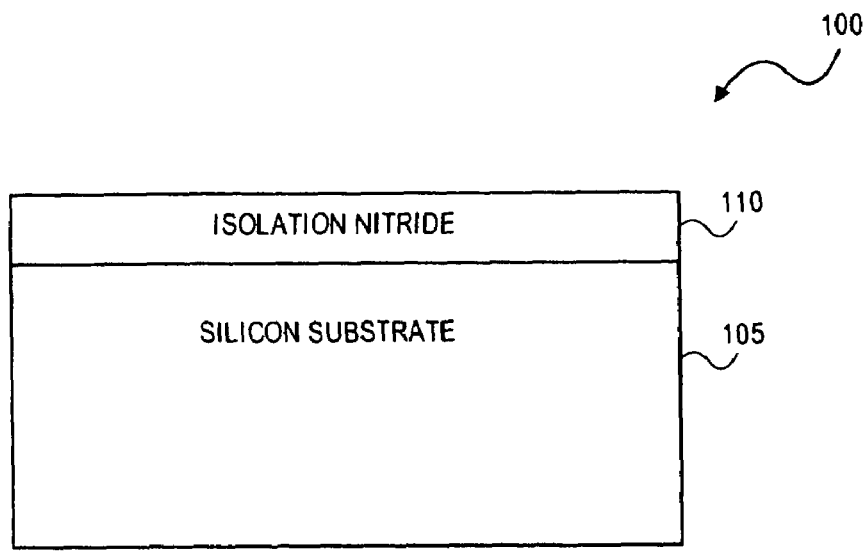
FIG. 1A
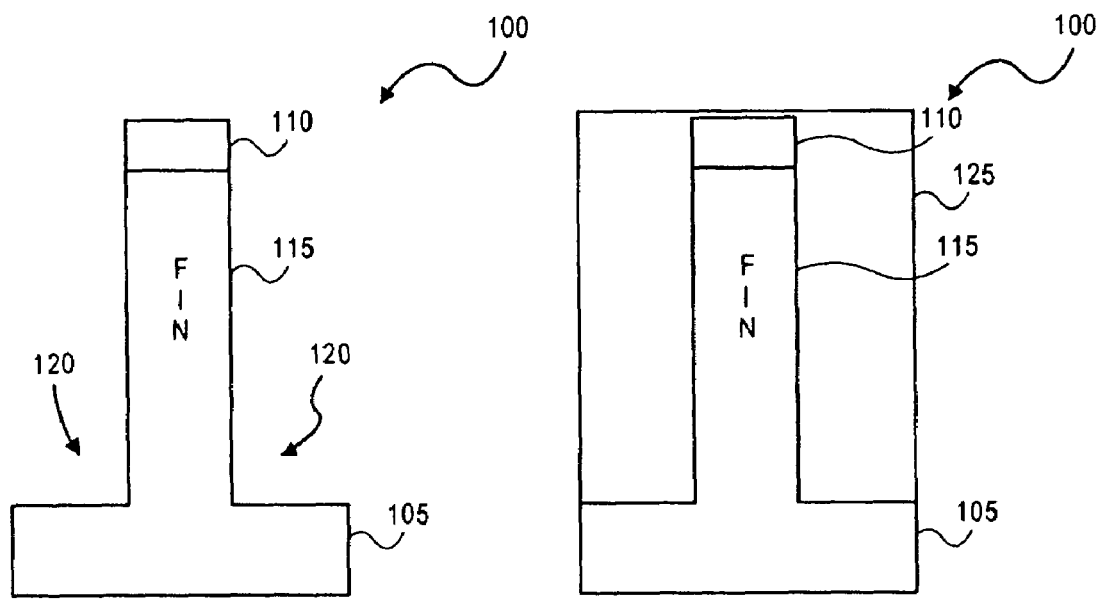
FIG. 1B  FIG. 1C

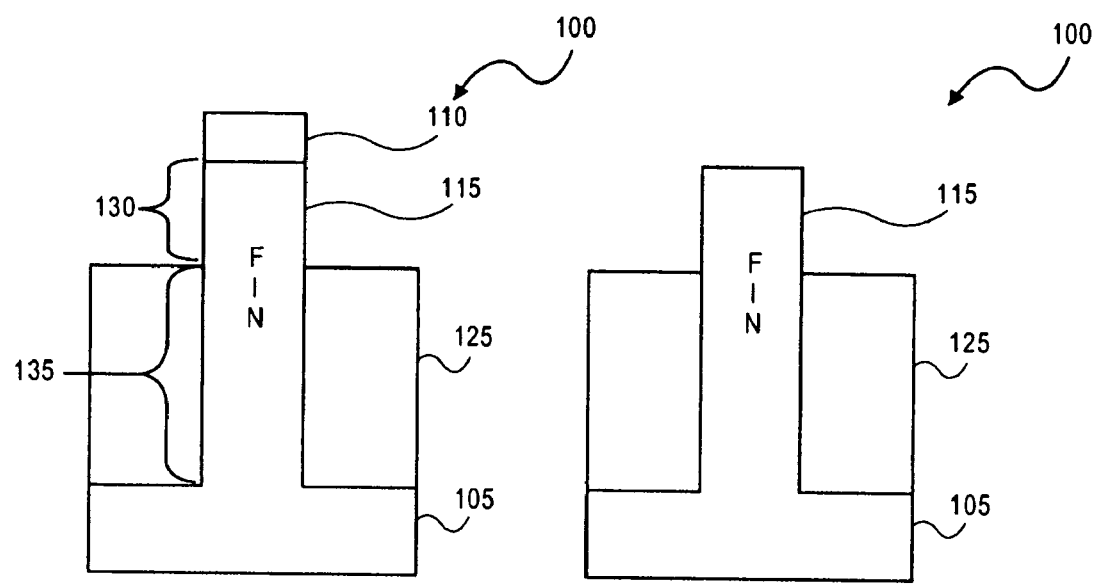
FIG. 1D  FIG. 1E

METHODS FOR INDUCING STRAIN IN NON-PLANAR TRANSISTOR STRUCTURES

FIELD OF INVENTION

Integrated circuit structures.

BACKGROUND OF INVENTION

Metal-oxide-semiconductor (MOS) transistors are the primary building blocks for modern integrated circuits. A typical highly integrated circuit, such as a microelectronic device, can contain millions of transistors on a single silicon substrate no bigger than a thumbnail. Generally, a transistor, or device, hereinafter referred to interchangeably, includes a gate structure formed on a substrate with a source region and a drain region, separated from each other by the gate structure and formed within the substrate, adjacent to the gate structure. A transistor may be thought of as an electronic switch having three nodes. When a voltage is applied to a first node of the transistor, i.e., the gate, the flow of electric current between the other two nodes, i.e., the source and the drain regions, via a channel region in the substrate below the gate, is modulated. For example, to turn one type of n-channel (NMOS) transistor "ON," a positive voltage is applied to the gate, allowing electrical current to flow between the source and drain. To turn this transistor "OFF," zero volts is applied to the gate which cuts off the flow of electrical current between the source and drain.

Process induced strain (sometimes referred to as stress) can greatly enhance the carrier mobility in short channel devices in conventional planar transistor devices. For example, in n-type metal-oxide-semiconductor field-effect transistors (MOSFETs), a conformal silicon nitride-capping layer ($Si_3N_4$) can be deposited on the transistor structure to induce tensile uniaxial strain resulting in electron mobility enhancement. In p-type MOSFETs, selective epitaxial deposition of $Si_{1-x}Ge_x$ can be introduced into the source/drain regions to create longitudinal compressive strain resulting in hole mobility enhancement.

A recent development in semiconductor processing is the non-planar transistor, or multi-gate transistor or tri-gate transistor. A tri-gate transistor includes a thin semiconductor body (e.g., a silicon fin) formed on a substrate and having a top-surface and two sidewall surfaces perpendicular to the top surface. A gate structure is formed on the substrate and the silicon fin, perpendicular to the silicon fin. Source and drain regions are formed in the fin on opposite sides of the gate structure. Because the gate structure surrounds the silicon fin on the three surfaces, the transistor essentially has three gates controlling the current through the fin or channel region. These three gates provide three channels for electrical signals to travel, thus effectively increasing the conductivity per unit surface area as compared to a conventional planar transistor.

Tri-gate transistors generally have superior performance to bulk gate devices. This is due to the proximity of the top and side gates relative to one another which causes full depletion and results in steeper sub-threshold current swing (SS) and smaller drain induced barrier lowering (DIBL). The SS and DIBL typically are used to determine short-channel effects (SCEs) in a transistor. In general, it is desired that SCEs are low such that the transistor off-state leakage current, $I_{OFF}$ (i.e., a current flowing between source and drain regions when a transistor is in an OFF state), remains as low as possible. A steeper SS and/or reduced DIBL indicates lower $I_{OFF}$, and thus smaller and typically better SCEs.

BRIEF DESCRIPTION OF DRAWINGS

FIG. 1A is a cross-sectional side view of an embodiment including a nitride layer on a substrate.

FIG. 1B shows the embodiment of FIG. 1A following photolithography and etching to form a semiconductor body.

FIG. 1C shows the embodiment of FIG. 1B following deposition of an oxide layer and a polish of the oxide down to the nitride polish stop.

FIG. 1D shows the embodiment of FIG. 1C following selective etching of the oxide layer.

FIG. 1E shows the embodiment of FIG. 1D following removal of the nitride layer.

DETAILED DESCRIPTION

Figure 2A:
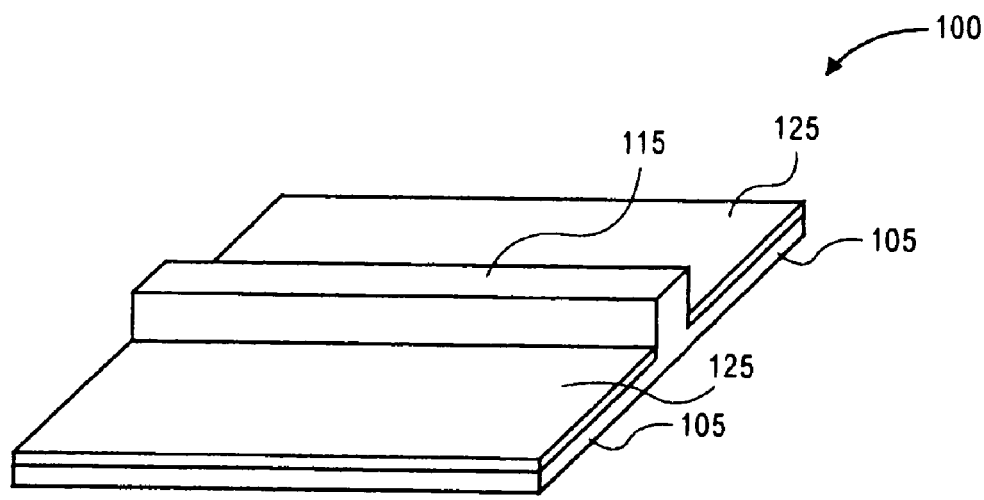
FIG. 2A shows a top perspective view of the embodiment of FIG. 1E.

While tensile strain can be implemented in a non-planar transistor structure in substantially the same manner as that of a conventional planar transistor structure, compressive strain is not as easily implemented in the non-planar transistor. In n-type MOSFETs, a conformal silicon nitride-capping layer is deposited on the transistor structure to induce tensile uniaxial strain. Thus, whether the structure is planar or non-planar is irrelevant because the nitride-capping layer is conformal in either type of structure. However, in p-type MOSFETs, a common way to create compressive strain is through selective epitaxial deposition of $Si_{1-x}Ge_x$ (sometimes referred to as epitaxial growth) into the recessed source/drain regions. In both planar and non-planar transistor structures, the $Si_{1-x}Ge_x$ can protrude beyond the surface of the source/drain regions. In a planar transistor structure, the walls of the recessed source/drain regions confine the $Si_{1-x}Ge_x$ resulting in hydrostatic pressure against the walls. This produces compressive strain within the channel region. In a non-planar transistor structure, however, the source/drain regions are within the silicon fin, which is in a different plane relative to the surface of the substrate (bulk silicon or silicon-on-insulator). Once the $Si_{1-x}Ge_x$ is deposited within the source/drain region of the silicon fin, however, the silicon fin provides only one wall with which the $Si_{1-x}Ge_x$ can be "confined." The equal but opposite side of the raised $Si_{1-x}Ge_x$ may be a free surface. Without confinement, it is anticipated that the $Si_{1-x}Ge_x$ is to produce hydrostatic pressure against the single silicon fin wall, and a compressive strain is not realized within the channel region of the non-planar transistor structure.

FIGS. 1A-1E illustrate cross-sectional views of one embodiment for forming a semiconductor body on a substrate. In FIG. 1A, isolation nitride 110, e.g., $Si_3N_4$ is deposited on substrate 105. Substrate 105 can be, for example, a bulk silicon substrate or a silicon-on-insulator (SOI) substrate. Referring to FIG. 1B, substrate 105 and isolation nitride 110 may be patterned by standard photolithography and etching to define non-planar semiconductor body 115 (or silicon body or silicon fin, hereinafter used interchangeably) relative to substrate 105.

In some embodiments, a photo-imaging material, such as a photoresist, may be used to pattern structure 100. Photoresists can be either negative or positive. In both forms, photoresists are typically three-component materials including a matrix, a photoactive compound and a solvent. For positive photoresists, the matrix may be a low-molecular weight novolac resin, the photoactive component may be a diazonaphthoquinone compound and the solvent system may be a mixture of n-butyl acetate, xylene and cellosolve acetate. For negative photoresists, the matrix may be cyclized synthetic rubber resin, the photoactive component may be a bis-arylazide compound and the solvent system may be an aromatic solvent. The photoresist material can be applied by various methods, such as spinning. After applying the photoresist material, ultraviolet light may be directed onto structure 100 through a mask to create a pattern. The areas which receive the ultraviolet light harden leaving unprotected exposed portions. Thereafter, a series of etching process may be performed to remove the exposed areas of isolation nitride 110 and substrate 105. The photoresist may then be stripped off by an ashing process using high temperature. As a result, as shown in FIG. 1B, trenches 120 are formed on either side of silicon fin 115. In some embodiments, silicon fin 115 may have a height dimension from about 50 nm to about 500 nm, more narrowly, from about 200 nm to about 300 nm and a width dimension from about 5 to about 50 nm. In FIG. 1C, isolation oxide 125 can be deposited onto structure 100 such that trenches 120 and isolation nitride 110 are covered. Isolation oxide 125 can then be planarized to the top of isolation nitride 110. In FIG. 1D, isolation oxide 125 may be wet-etched (or dry etched) down to a predetermined point, e.g., about 100-1000 Å, more narrowly, about 200 Å, below its original level to expose a portion of silicon fin 115. Thus, silicon fin 115 can comprise non-planar portion 130 and buried portion 135. Referring to FIG. 1E, isolation nitride 110 on silicon fin 115 may be removed.

Figure 2B:
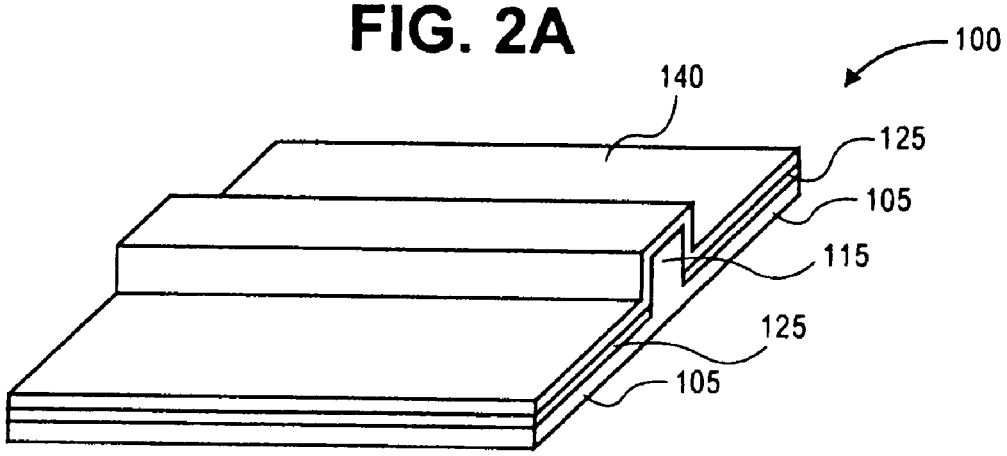
FIG. 2B shows the embodiment of FIG. 2A following deposition of a gate dielectric layer.
Figure 2C:
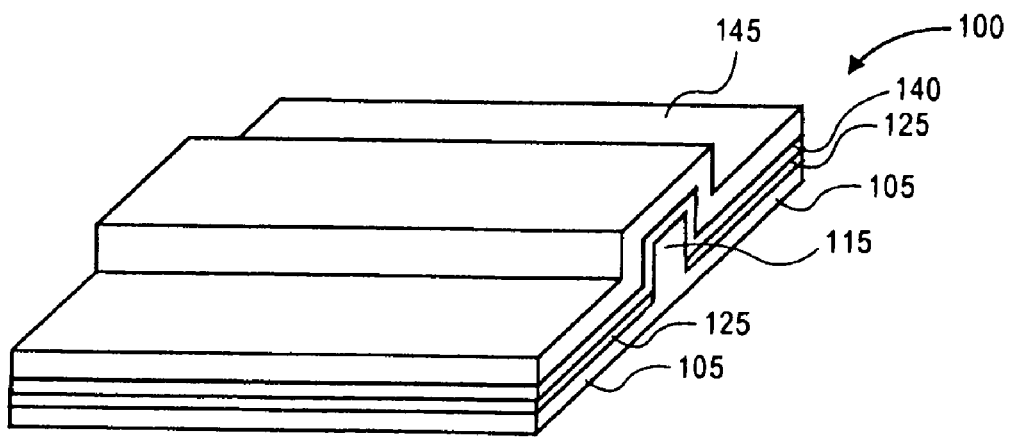
FIG. 2C shows the embodiment of FIG. 2B following deposition of a gate electrode layer.

FIGS. 2A-2E illustrate one embodiment of forming a gate structure on non-planar structure 100. FIG. 2A shows a perspective view of structure 100 shown in FIG. 1E. In FIG. 2B, a gate dielectric material is conformally deposited over structure 100 forming gate dielectric layer 140. Gate dielectric layer 140 can be a dielectric material such as silicon dioxide or a material having a dielectric constant greater than silicon dioxide. In some embodiments, gate dielectric layer 140 can be a high dielectric constant (high-k) dielectric material, such as hafnium oxide ($HfO_2$), lanthanum oxide, ($La_2O_3$), zirconium oxide, ($ZrO_2$), and tantalum oxide ($Ta_2O_5$). Gate dielectric layer 140 can be deposited by, for example, atomic layer deposition (ALD). In some embodiments, gate dielectric layer 140 can be about 20 Å. Following the deposition of gate dielectric layer 140, a gate electrode material may be conformally deposited over the gate dielectric material forming gate electrode layer 145 (FIG. 2C). In general, a suitable material for a gate electrode is, for example, a metal material selected to have a work function, in this embodiment, near the middle of the silicon energy gap. In some embodiments, gate electrode layer 145 can be a polycrystalline semiconductor material, such as polycrystalline silicon (polysilicon) or polysilicon germanium (poly-SiGe) with workfunctions closer to the conduction band or valence band of silicon. Gate electrode layer can be doped above $1E20/cm^3$. Gate electrode layer 145 can be deposited by, for example, chemical vapor deposition (CVD). In some embodiments, gate electrode layer 145 can be about 1000 Å. In one embodiment, an additional thin conformal metal layer (not shown) can be deposited between gate dielectric layer 140 and gate electrode layer 145 by a plasma vapor deposition process (PVD), thermal CVD, plasma enhanced CVD (PECVD) or atomic layer deposition ALD.

Figure 2D:
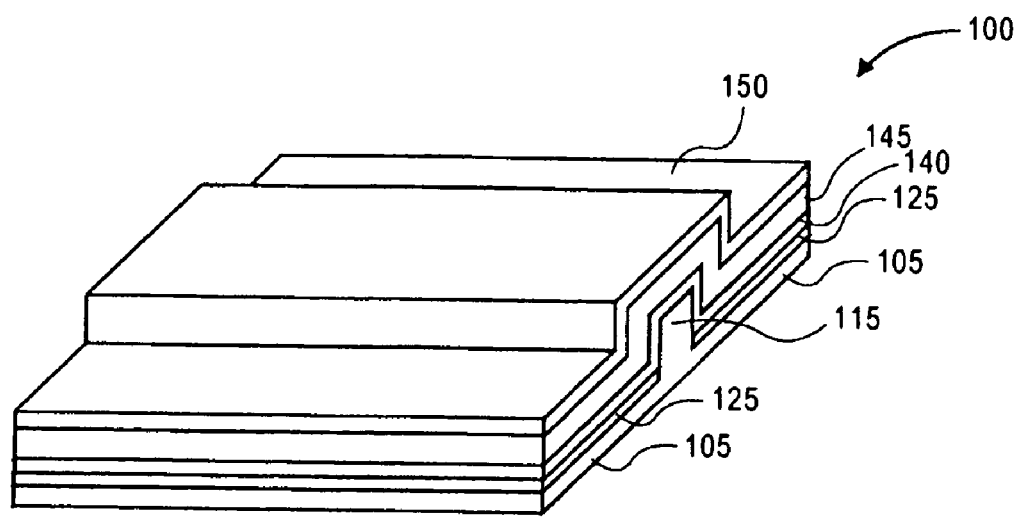
FIG. 2D shows the embodiment of FIG. 2C following deposition of a gate hard-mask layer.
Figure 2E:
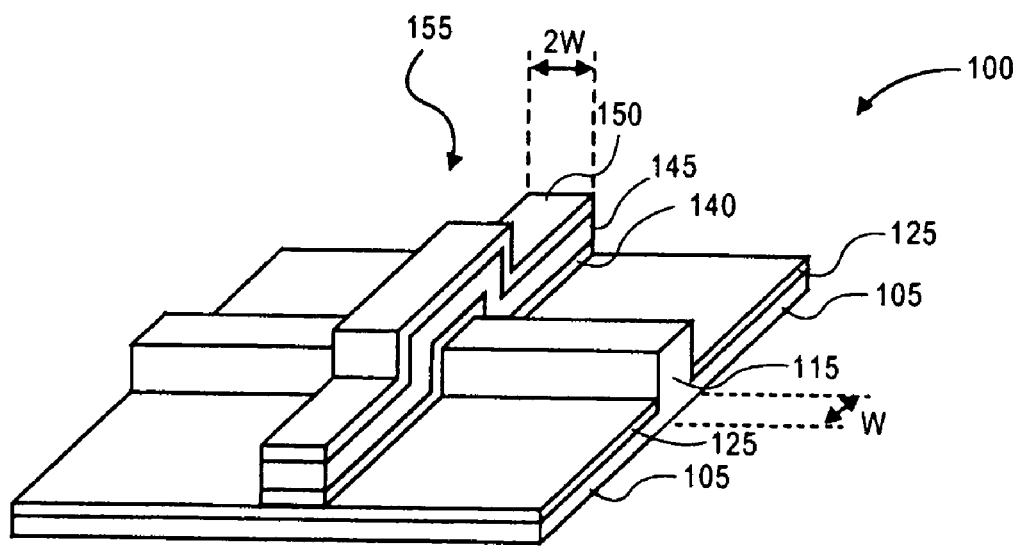
FIG. 2E shows the embodiment of FIG. 2D following photolithography and etching to form a gate structure.

Following a conformal deposition of materials for gate dielectric layer 140 and gate electrode layer 145, a dielectric etch-stop material, for example, a silicon nitride or silicon oxynitride material is deposited on gate electrode layer 145, forming dielectric hard mask layer 150 (FIG. 2D). Thereafter, the materials may be patterned by, for example, photolithography and an etching process to define a gate structure 155 (FIG. 2E). In some embodiments, gate structure 155 is twice the width (2 W) as silicon fin 115 (W). For example, silicon fin 115 may be 20 nm in width and gate structure 155 may be 40 nm in width. In some embodiments, silicon fin 115 is tip doped using processes known in the art or using uniform tip doping.

Figure 3A:
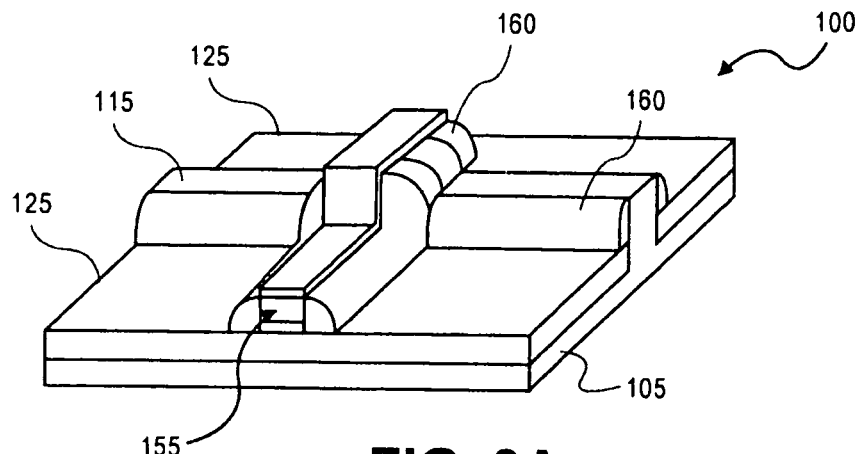
FIG. 3A shows the embodiment of FIG. 2E following deposition of a conformal nitride layer and subsequent etching to form spacers on the sidewalls of the gate structure and the semiconductor body.

FIGS. 3A-3G illustrate an embodiment of forming source/drain trench regions in a silicon body. FIG. 3A shows spacers 160 on the sidewalls of silicon fin 115 and gate structure 155. In some embodiments, a conformal nitride layer (not shown) can be deposited on structure 100. The conformal nitride layer can be applied by processes known in the art. Examples of such processes include, but are not limited to, PVD, ALD, CVD, low pressure CVD, plasma-enhanced CVD or any other suitable process. Examples of materials which can be used for conformal nitride layer include, but are not limited to, silicon nitride ($Si_3N_4$), oxynitride ($SiO_yN_x$) and silicon carbide (SiC). Conformal nitride layer can be in a thickness range from about 50 Å to about 1000 Å.

After depositing conformal nitride layer on structure 100, an etching process can be used to create spacers 160 on the sidewalls of silicon fin 115 and gate structure 155. In some embodiments, an anisotropic etching process is used. "Anisotropic etching" is an etch process that generally exhibits little or no lateral or isotropic etching, resulting in features whose sides are perpendicular to the underlying layer. In some embodiments, a reactive ion plasma etching process is used to achieve such an anisotropic etch using chemistries such as $C_2F_6$ or $C_4F_8$.

Figure 3B:
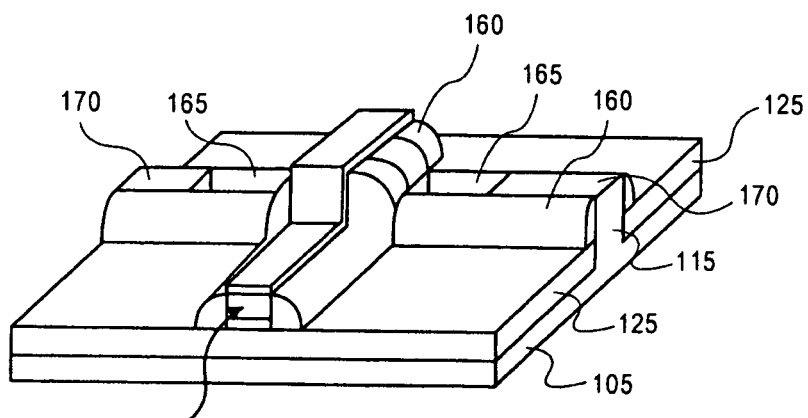
FIG. 3B shows the embodiment of FIG. 3A following the formation of trenches in the semiconductor body.

FIG. 3B shows source/drain trenches 165 in silicon fin 115. In some embodiments, trenches 165 are adjacent to spacers 160 next to gate structure 155 and substantially adjacent to gate structure 155. Trenches 165 may be formed using photolithography and an etching process. For example, a sacrificial layer such as a photoimageable species (including a photoresist) can be deposited and selectively etched on at least silicon fin 115 in preparation for forming trenches 165. In some embodiments, the etching process can be anisotropic. As a result of these processes, silicon fin pillars 170 remain adjacent to trenches 165.

Figure 3C:
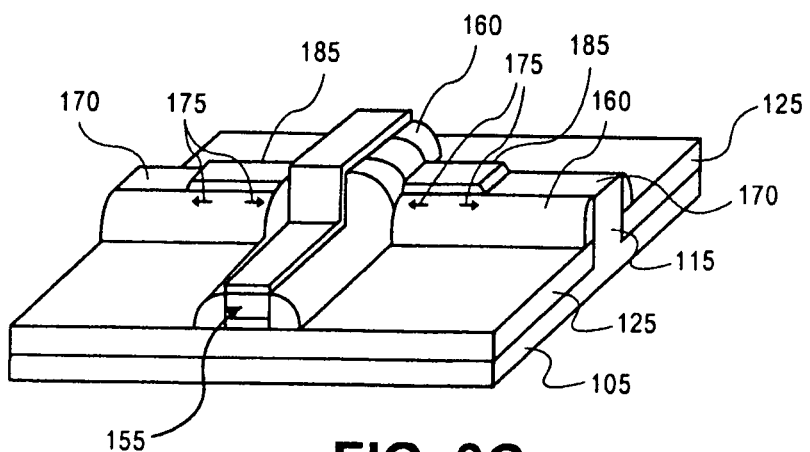
FIG. 3C shows the embodiment of FIG. 3B following deposition of a strain material in the trenches of the semiconductor body.

FIG. 3C shows deposition of a strain material in trenches 165 of silicon fin 115. In some embodiments, silicon germanium 185 can be deposited in trenches 165. In some embodiments, the silicon germanium material may be formed by an epitaxial deposition method. The deposition method can form a silicon germanium material having the general chemical formula $Si_{1-x}Ge_x$ where x is selected to induce the desired strain in a channel region, and may be from about 0.05 to about 0.3. In some embodiments, x equals 0.17. An epitaxially deposited silicon germanium material may be capable of creating a uniaxial compressive strain that enhances carrier mobility in the channel region(s) of the tri-gate transistor. An epitaxially grown silicon germanium material can be formed in the trenches 165 by exposing the substrate 100 to a silicon-containing gas which may be, for example, silane, and a germanium-containing gas which may be, for example, germane. The components of the gas can be energized to form the silicon germanium material within trenches 165, by providing sufficient thermal energy for the reaction to occur, such as by heating the substrate 100 to a sufficiently high temperature. In some embodiments, a gas energizer, such as an RF or microwave energizer, can also or alternatively be provided to energize the deposition gas. In some embodiments, silicon pillars 170 provide a "retaining wall" with which to confine the silicon germanium. As a result, it is anticipated that the silicon germanium can exert hydrostatic pressure against the sidewalls of silicon pillars 170 (shown by arrows 175) and spacers 160 adjacent to gate structure 155 and the channel of silicon body 115. The result can be a net compressive strain in the channel region (not shown in this figure). In some embodiments, silicon pillars 170 can serve as additional contact landing pads.

Figure 3D:
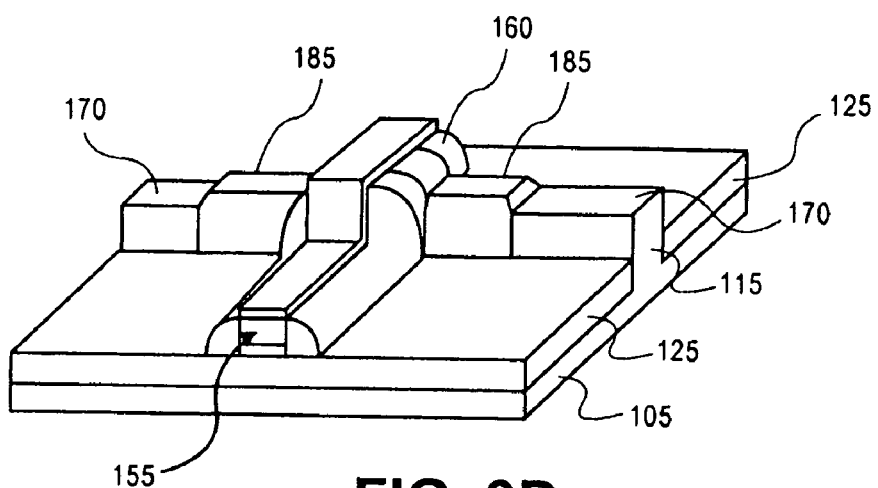
FIG. 3D shows the embodiment of FIG. 3C following selective removal of the spacer on the sidewalls on the semiconductor body.
Figure 3E:
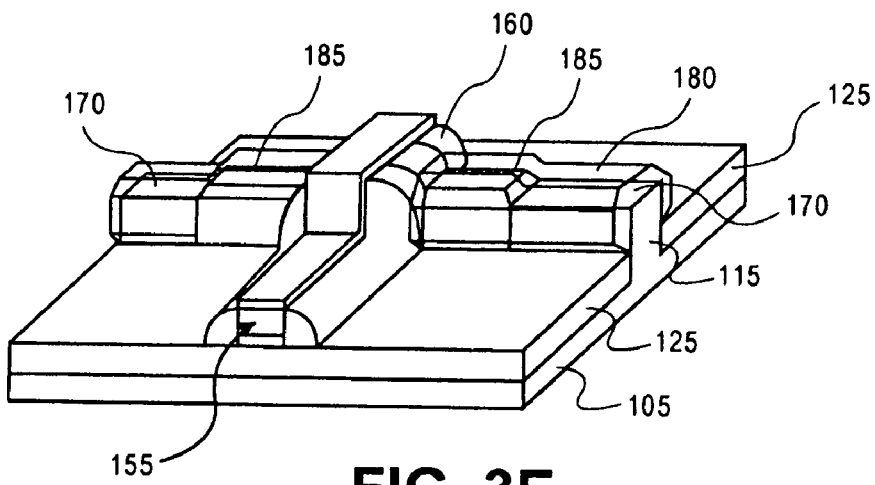
FIG. 3E shows the embodiment of FIG. 3D following a second deposition of a strain material.
Figure 3F:
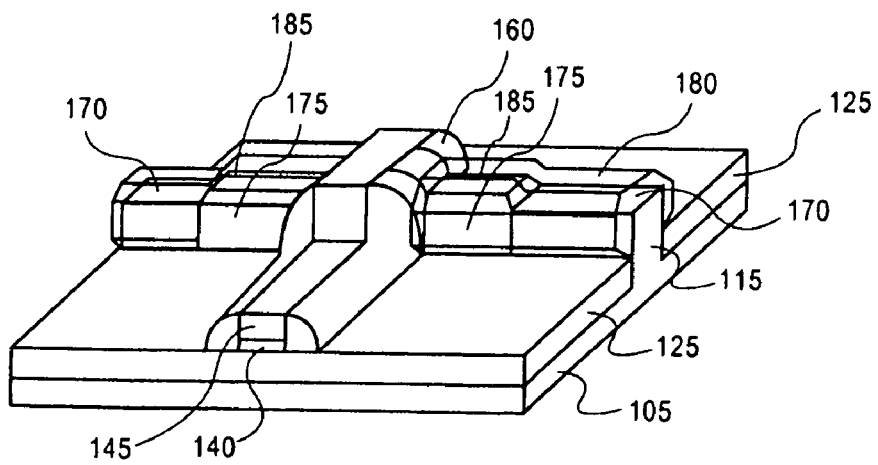
FIG. 3F shows the embodiment of FIG. 3E following removal of a hard mask of the gate structure.

FIG. 3D shows the selective removal of spacers 160 adjacent to silicon fin 115. The selective etching can be done by an etching process or a combination of photolithography and an etching process. In some embodiments, the etching process can be isotropic. "Isotropic etching" is a process in which etching occurs equally in all directions. Following selective removal of spacers 160 adjacent to silicon fin 115, a second epitaxial silicon germanium process can be performed on silicon fin 115, including trenches 165 containing silicon germanium (FIG. 3E). Second epitaxial deposition layer 180 may be deposited to optimize the external parasitic resistance ($R_{ext}$). Following the second epitaxial deposition, hard mask 150 of gate structure 155 may be removed, followed by industry standard methods to form source/drain regions, silicide regions, interlayer dielectrics, planarization, contact, metal and passivation (FIG. 3F).

Figure 3G:
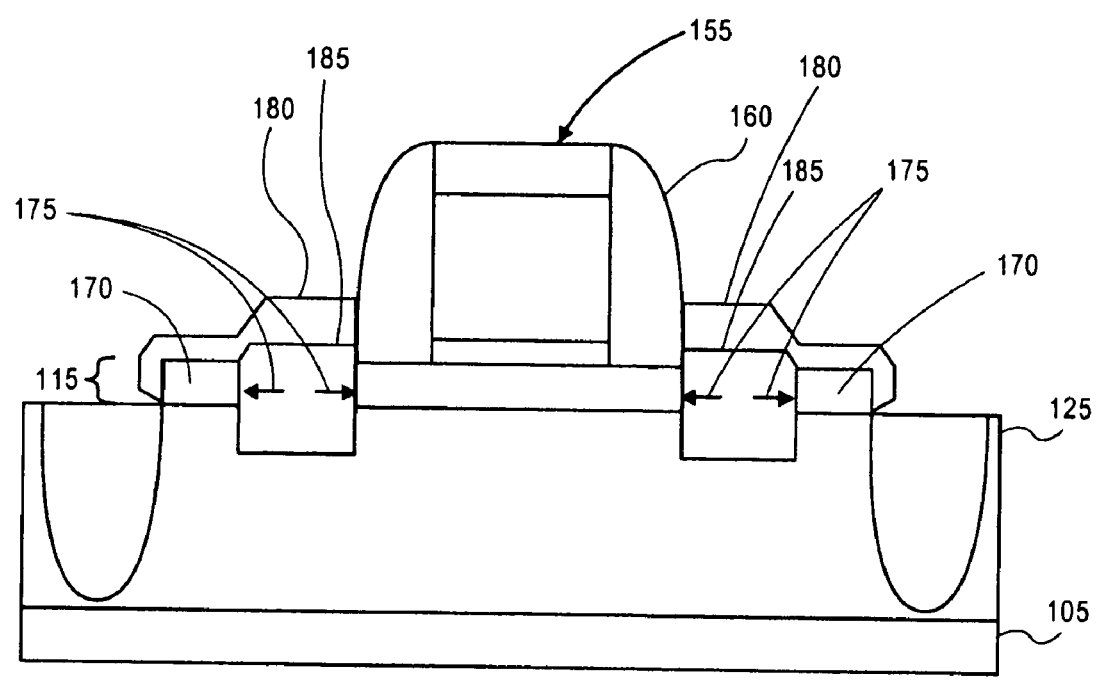
FIG. 3G shows a cross-sectional view of the embodiment of FIG. 3E.

FIG. 3G is a cross-sectional view of FIG. 3E after second epitaxial deposition layer 180 has been selectively deposited on silicon fin 115. As can be seen, silicon pillars 170 provide a containment sidewall with which to contain the epitaxial silicon germanium. As a result, it is anticipated that the silicon germanium exerts hydrostatic pressure against the sidewalls of silicon pillars 170 (shown by arrows 175) and spacers 160 adjacent to gate structure 155 and silicon body 115. The result can be a net compressive strain in the channel region (not shown in this figure).

Figure 4:
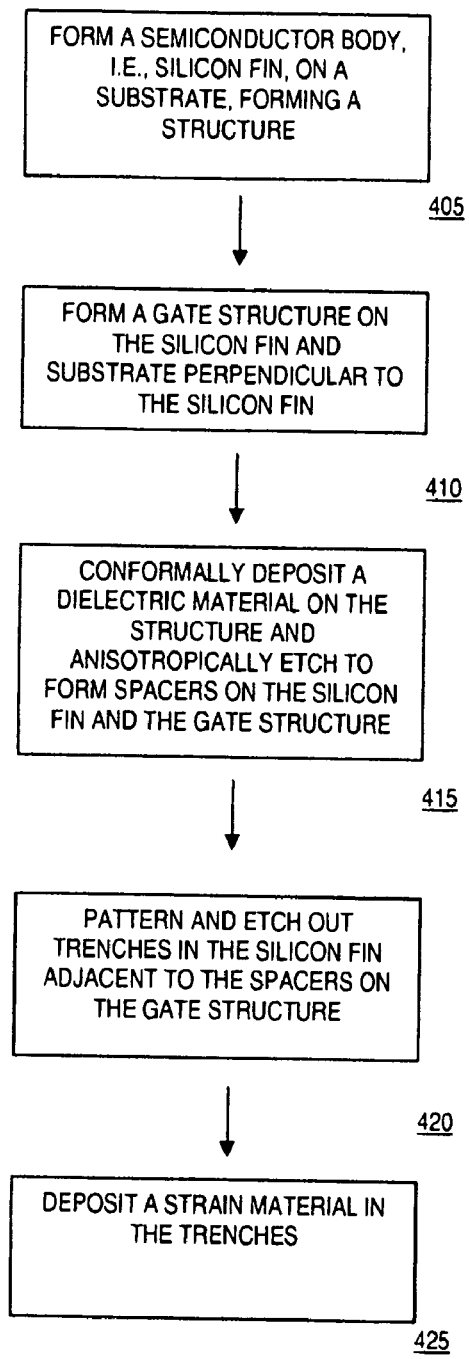
FIG. 4 illustrates a schematic of an embodiment of a method of introducing stain in a non-planar tri-gate transistor.

FIG. 4 represents a schematic of an embodiment of forming source/drain trench regions in a silicon body. In some embodiments, a PMOS tri-gate transistor with a strained channel region can be fabricated (400). According to process 400, a semiconductor body, or silicon fin, can be formed on a substrate forming a structure (405). The substrate can be bulk silicon or SOI. A gate structure can be formed on the substrate and on the silicon fin, wherein the gate structure is perpendicular to the silicon fin (410). A dielectric material can be conformally deposited on the structure and anisotropically etched to form spacers adjacent to the gate structure and the silicon fin (415). Trenches in the silicon fin can be patterned and etched out adjacent to the spacers on the gate structure (420). A strain material can be deposited and re-grown in the trenches (425). In one embodiment, strain material is silicon germanium ($Si_{1-x}Ge_x$). Remaining silicon fin "pillars", adjacent to the trenches, can provide sidewalls with which to confine the strain material. As a result, it is anticipated that compressive strain is realized in the channel region of the tri-gate transistor. Optionally, the spacers on the silicon fin can be selectively removed, followed by a second deposition of a strain or unstrained material on the silicon fin, followed by processes to complete fabrication of a tri-gate transistor by methods known by those skilled in the art.

It should be appreciated that embodiments of the present invention are not limiting, and such embodiments can be used to form, for example, complementary metal oxide semiconductor (CMOS) circuits. For example, a multi-gate transistor or transistors can form a portion of a circuit in which, for a CMOS inverter, an nMOS device and a pMOS device are connected between a power supply voltage and a ground and gated by the same input signal. In addition, it should be appreciated that impurity implantation, i.e., "doping", can be used in conjunction with embodiments of the present invention. Doping can include both tip doping, source/drain doping and doping of various materials that comprise a non-planar transistor.

Figure 5:
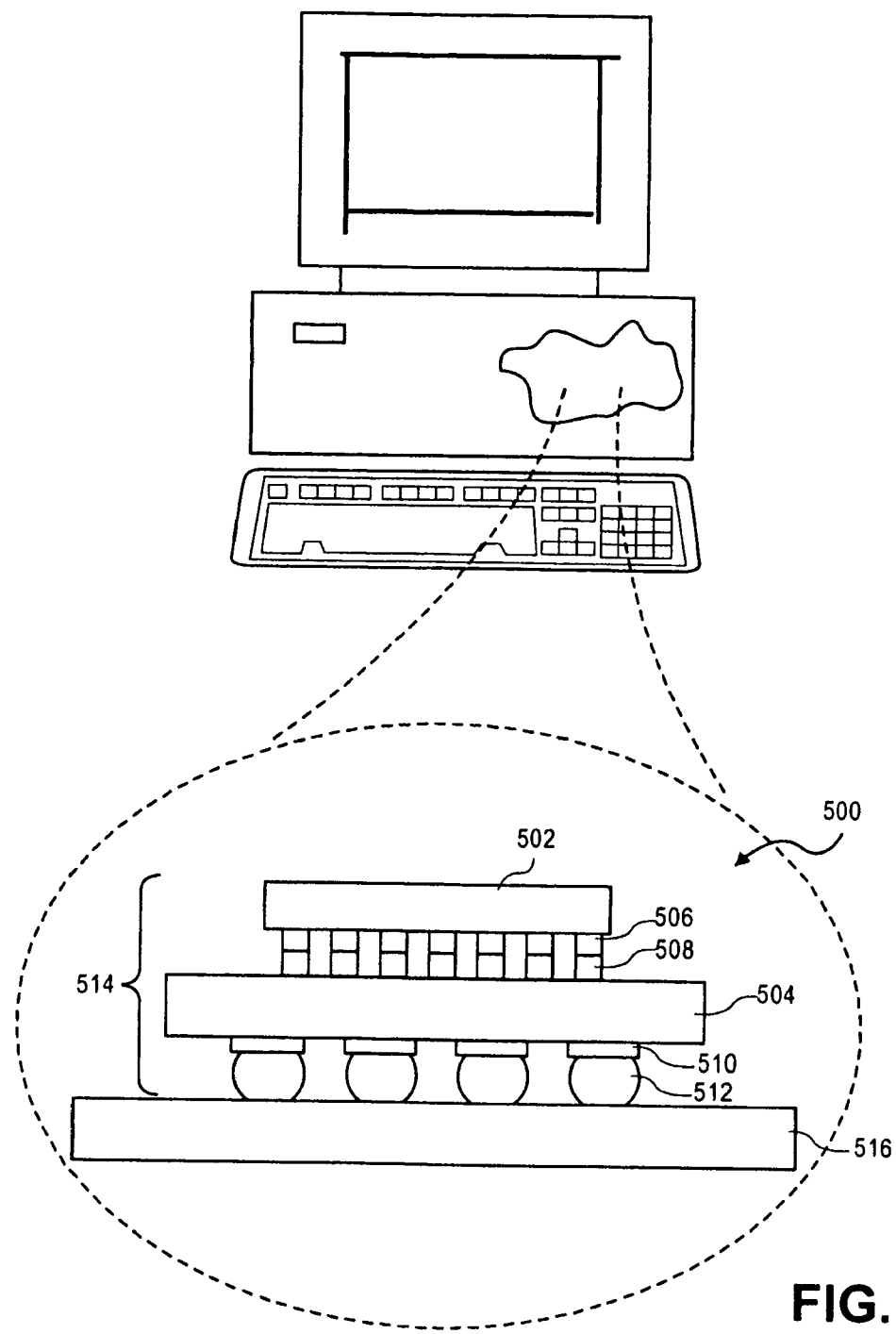
FIG. 5 shows a computer system including microprocessor enclosed by a package mounted to a printed circuit board.

FIG. 5 shows a cross-sectional side view of an integrated circuit package that is physically and electrically connected to a printed wiring board or printed circuit board (PCB) to form an electronic assembly. The electronic assembly can be part of an electronic system such as a computer (e.g., desktop, laptop, handheld, server, etc.), wireless communication device (e.g., cellular phone, cordless phone, pager, etc.), computer-related peripheral (e.g., printer, scanner, monitor, etc.), entertainment device (e.g., television, radio, stereo, tapes and compact disc player, video cassette recorder, motion picture expert group audio layer 3 player (MP3), etc.), and the like. FIG. 5 illustrates the electronic assembly as part of a desktop computer. FIG. 5 shows electronic assembly 500 including die 502, physically and electrically connected to package substrate 504. Die 502 is an integrated circuit die, such as a microprocessor die, having, for example, transistor structures interconnected or connected to power/ground or input/output signals external to the die through interconnect lines to contacts 506 on an external surface of die 502. The die may be formed in accordance with known wafer processing techniques using as the substrate described with reference to FIGS. 3A-3F. Contacts 506 of die 502 may be aligned with contacts 508 making up, for example, a die bump layer on an external surface of package substrate 504. On a surface of package substrate 504 opposite a surface including contacts 508 are land contacts 510. Connected to each of land contacts 510 are solder bumps 512 that may be used to connect package 514 to circuit board 516, such as a motherboard or other circuit board.

In the foregoing specification, specific embodiments have been described. It will, however, be evident that various modifications and changes can be made thereto without departing from the broader spirit and scope of the appended claims. The specification and drawings are, accordingly, to be regarded in an illustrative rather than a restrictive sense.

What is claimed is:

1. A method comprising:
   selectively forming a sacrificial layer on a substrate and partially on a silicon body, the silicon body on and extending above the substrate, a gate structure substantially perpendicular to the silicon body and formed on a top surface and a first pair of opposing side walls of the silicon body; wherein a first portion of the silicon body substantially adjacent to at least two sidewalls of the gate structure, adjacent to and parallel with the top surface is exposed through the sacrificial layer;
   forming at least one trench region in the exposed portion of the silicon body; and
   depositing a strain material in the at least one trench region.

2. The method of claim 1, further comprising:
   before selectively forming the sacrificial layer, depositing a layer of dielectric material on the non-planar substrate; and
   anisotropically removing the layer of dielectric material wherein a first spacer remains on at least two sidewalls of the silicon body and a second spacer remains on the at least two sidewalls of the gate structure.

3. The method of claim 2, further comprising:
   before depositing the layer of dielectric material, forming the silicon body on the substrate, wherein the silicon body is in a different plane relative to a surface of the substrate;
   forming an isolation layer around the silicon body and on the surface of the substrate, wherein a second portion of the silicon body remains in the different plane relative to the isolation layer; and
   forming the gate structure on the isolation layer and partially on the second portion of the silicon body, the gate structure substantially perpendicular to the silicon body.

4. The method of claim 3, wherein the silicon body is formed by an ion etching process.

5. The method of claim 3, wherein the gate structure comprises a first gate layer, a second gate layer and a third gate layer, the first layer comprising a high-k dielectric material.

6. The method of claim 3, wherein the substrate is one of bulk silicon or silicon-on-insulator.

7. The method of claim 1, wherein the at least one trench region includes at least two sidewalls.

8. The method of claim 7, wherein the strain material exerts hydrostatic pressure against the at least two sidewalls of the trench region.

9. The method of claim 7, wherein the strain material is one of $Si_{1-x}Ge_x$ or a material whose lattice constant differs from that of the lattice constant in a channel of the substrate.

10. The method of claim 1, wherein selectively forming a sacrificial layer comprises a second portion of the silicon body substantially adjacent to at least two side walls of the gate structure, adjacent to and parallel with the top surface is exposed through the sacrificial layer;
    forming at least two trench regions in the first and second portion of the silicon body; and
    depositing the strain material in the two trench regions.

11. The method of claim 10, wherein the trench regions include three source/drain sidewalls on and extending above the substrate; and wherein the strain material exerts a hydrostatic pressure towards and a compressive strain across a pair of opposing channel side walls of the silicon body that are perpendicular to the first pair of opposing sidewalls, due to the three source/drain side walls of the trench retaining the strain material.

12. The method of claim 1 wherein the silicon body comprises a silicon fin channel, source and drain of a P-type fin MOSFET; wherein the silicon body comprises three gate surfaces and two source/drain surfaces; and wherein the strain material exerts a hydrostatic pressure towards and a compressive strain across the two source/drain surfaces.

* * * * *